(12) United States Patent
Watanabe

(10) Patent No.: US 9,006,855 B2
(45) Date of Patent: Apr. 14, 2015

(54) SOLID-STATE IMAGE PICKUP ELEMENT AND ELECTRONIC DEVICE

(75) Inventor: Taiichiro Watanabe, Kanagawa (JP)

(73) Assignee: Sony Corporation (JP)

( * ) Notice: Subject to any disclaimer, the term of this patent is extended or adjusted under 35 U.S.C. 154(b) by 442 days.

(21) Appl. No.: 13/561,750

(22) Filed: Jul. 30, 2012

(65) Prior Publication Data
US 2013/0032919 A1 Feb. 7, 2013

(30) Foreign Application Priority Data

Aug. 4, 2011 (JP) .................................. 2011-170735

(51) Int. Cl.
*H01L 31/00* (2006.01)
*H04N 5/359* (2011.01)
*H01L 27/146* (2006.01)

(52) U.S. Cl.
CPC .......... *H04N 5/3591* (2013.01); *H01L 27/1461* (2013.01); *H01L 27/14645* (2013.01); *H01L 27/14656* (2013.01)

(58) Field of Classification Search
CPC ............. H01N 5/3591; H01L 27/1461; H01L 27/14645; H01L 27/14656
USPC ........................................... 257/443, E31.113
See application file for complete search history.

(56) References Cited

U.S. PATENT DOCUMENTS

2010/0079652 A1*  4/2010  Kanbe ........................... 348/311
2010/0289929 A1*  11/2010  Ohwa et al. .................... 348/241

FOREIGN PATENT DOCUMENTS

JP         2010-114274        5/2010

* cited by examiner

*Primary Examiner* — David S Blum
(74) *Attorney, Agent, or Firm* — Sheridan Ross P.C.

(57) ABSTRACT

There is provided a solid-state image pickup element including a pixel array part in which a plurality of pixels are arranged on a silicon substrate in arrays, and a drive part driving the pixel. The pixel includes a photoelectric conversion part formed near a second face of the silicon substrate opposite to a first face on which a wiring layer is laminated, for generating a charge corresponding to incident light, an overflow part formed in contact with the second face and fixed to a predetermined voltage, and a potential barrier part formed to be connected with the photoelectric conversion part and the overflow part, for serving as a barrier against a charge overflowed from the photoelectric conversion part on the overflow part.

11 Claims, 10 Drawing Sheets

SOLID-STATE IMAGE PICKUP ELEMENT AND ELECTRONIC DEVICE

BACKGROUND

The present disclosure relates to a solid-state image pickup element and an electronic device, particularly to a solid-state image pickup element and an electronic device which ensures stable overflow.

In general, a solid-state image pickup device such as a CMOS (Complementary Metal Oxide Semiconductor) image sensor or CCD (Charge Coupled Device) is widely used for a digital still camera, a digital video camera or the like. For example, incident light on the CMOS image sensor is photoelectrically converted by PD (Photodiode) included in a pixel. Then, a charge generated in PD is transferred to FD (Floating Diffusion) via a transfer transistor and converted by FD to a pixel signal of a level corresponding to an amount of received light and the pixel signal is read out.

In the past, a method of forming PD at a deeper portion of a silicon substrate below a pixel transistor, or a method of laminating PD in a depth direction are disclosed as methods for increasing a saturation charge amount of the solid-state image pickup element.

For example, a method of using a vertical transfer transistor having a channel direction perpendicular to a semiconductor substrate for improving readout performance of a charge from PD that is formed in a deep part of a silicon substrate is disclosed in Japanese Patent Laid-Open No. 2010-114274.

In general, an overflow drain is formed in a solid-state image pickup element as an overflow destination for inhibiting a charge stored in PD from overflowing in various directions to affect imaging property when light of high illumination is incident upon a solid-state image pickup element. The overflow drain is a type used with FD or a diffusion region set at a source voltage.

SUMMARY

However, in such structure of reading out a charge by using the above-described vertical transfer transistor, it is difficult to overflow a charge from PD formed near a rear face of the silicon substrate on the overflow drain formed on a surface of the silicon substrate.

In view of the above-described problem, it is desirable to ensure stable overflow from PD.

According to an embodiment of the present disclosure, a solid-state image pickup element including a pixel array part in which a plurality of pixels are arranged on a silicon substrate in arrays, and a drive part driving the pixel. The pixel includes a photoelectric conversion part formed near a second face of the silicon substrate opposite to a first face on which a wiring layer is laminated, for generating a charge corresponding to incident light, an overflow part formed in contact with the second face and fixed to a predetermined voltage, and a potential barrier part formed to be connected with the photoelectric conversion part and the overflow part, for serving as a barrier against a charge overflowed from the photoelectric conversion part on the overflow part.

According to another embodiment of the present disclosure, an electronic device incorporating a solid-state image pickup element including a pixel array part in which a plurality of pixels are arranged on a silicon substrate in arrays, and a drive part driving the pixels. The pixel includes a photoelectric conversion part formed near a second face of the silicon substrate opposite to a first face on which a wiring layer is laminated, for generating a charge corresponding to incident light, an overflow part formed in contact with the second face and fixed to a predetermined voltage, and a potential barrier part formed to be connected with the photoelectric conversion part and the overflow part, for serving as a barrier against a charge overflowed from the photoelectric conversion part on the overflow part.

According to the embodiments of the present disclosure, a charge generated corresponding to incident light in a photoelectric conversion part formed near the second face of the silicon substrate overflows on an overflow part formed in contact with the second face and fixed at a predetermined voltage via a potential barrier part serving as a barrier against a charge.

According to the embodiments of the present disclosure, stable overflow from PD is ensured.

DETAILED DESCRIPTION OF THE EMBODIMENTS

Figure 1:
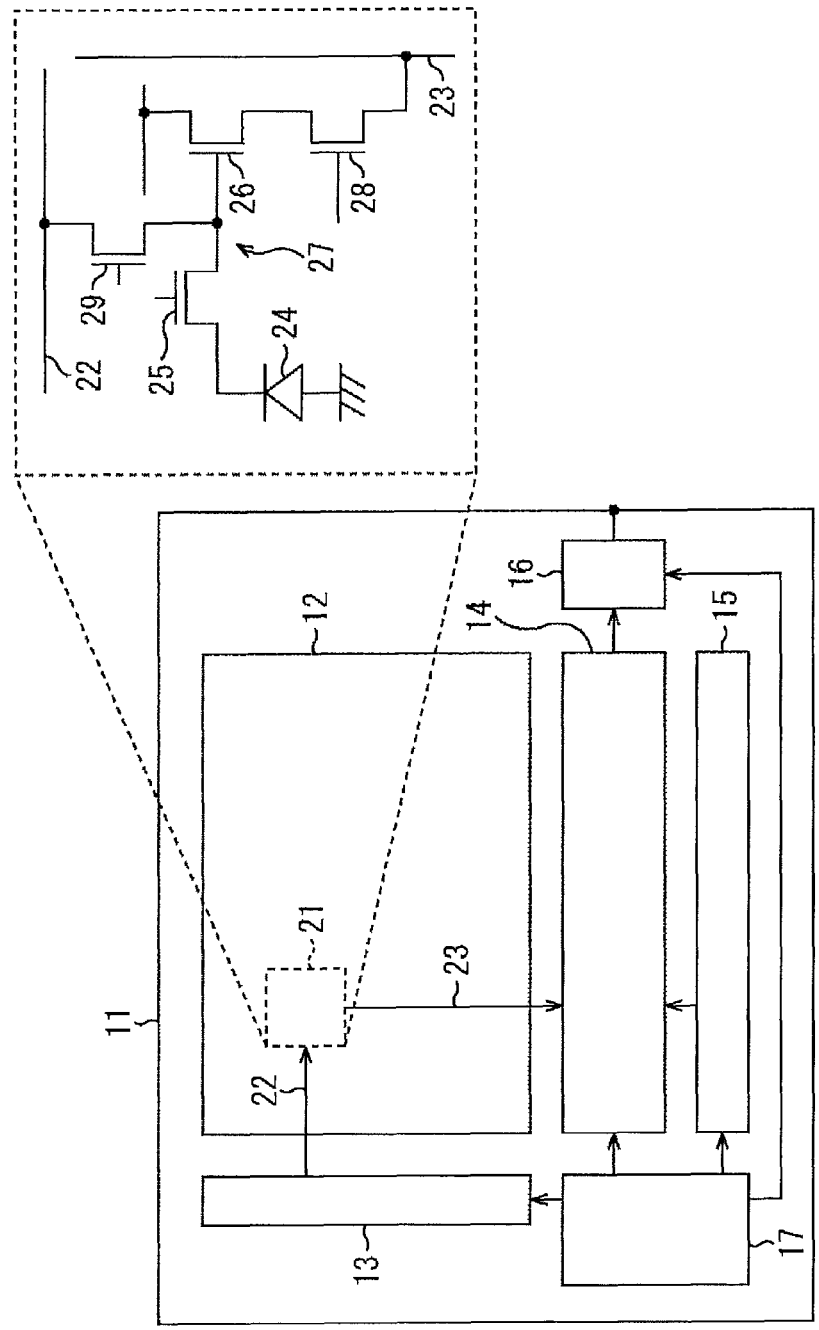
FIG. 1 is a block diagram illustrating a configuration example of an embodiment of an image pickup element of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

FIG. 1 is a block diagram illustrating a configuration example of an embodiment of an image pickup element of the present disclosure.

As illustrated in FIG. 1, an image pickup element 11 is a CMOS solid-state image pickup element and includes a pixel array part 12, a vertical drive part 13, a column processing part 14, a horizontal drive part 15, an output part 16 and a drive control part 17.

The pixel array part 12 includes a plurality of pixels 21 arranged in arrays. The pixel array part 12 is connected to the vertical drive part 13 via a plurality of horizontal signal lines 22 corresponding in number to the number of rows of the pixels 21, and connected to the column processing part 14 via a plurality of vertical signal lines 23 corresponding in number to the number of columns of the pixels 21. That is, each of the plurality of pixels 21 included in the pixel array part 12 is arranged on each intersection of the horizontal signal line 22 and the vertical signal line 23.

The pixel 21 is configured as illustrated in an enlarged manner on the right side of FIG. 1, for example, such that a charge generated in PD 24 serving as a photoelectric conversion part is transferred to FD 27 serving as a floating diffusion region via a transfer transistor 25 in accordance with drive by the vertical drive part 13. Subsequently, when a pixel 21 is set as a readout target, a select transistor 28 is turned on in accordance with drive by the vertical drive part 13, a pixel signal at a level corresponding to that of a charge stored in FD 27 is output from an amplification transistor 26 via the select transistor 28 to the vertical signal line 23. And when a reset transistor 29 is turned on, a charge stored in FD 27 is reset and a pixel signal at the reset level is output from the amplification transistor 26 via the select transistor 28 to the vertical signal line 23.

The vertical drive part 13 sequentially supplies drive signals for driving (transfer, select or reset) respective pixels 21 in every plurality of rows of pixels 21 included in the pixel array part 12 via the horizontal signal lines 22.

The column processing part 14 extracts signal levels of the respective pixel signals via the vertical signal lines 23 by performing CDS (Correlated Double Sampling) processing on the pixel signals output from respective pixels 21 to obtain pixel data corresponding to an amount of received light of each pixel 21.

The horizontal drive part 15 sequentially supplies drive signals to the column processing part 14 with respect to each column of plurality of pixels 21 included in the pixel array part 12 for causing the column processing part 14 to output the pixel data obtained from each pixel 21.

The pixel data is supplied to the output part 16 from the column processing part 14 at the timing in accordance with the drive signals supplied from the horizontal drive part 15. The output part 16 amplifies the pixel data, for example, and outputs to a downstream image processing circuit.

The drive control part 17 controls driving of each block inside the image pickup element 11. For example, the drive control part 17 creates a clock signal in accordance with a drive cycle of each block and supplies the created clock signal to each block.

Figure 2A:
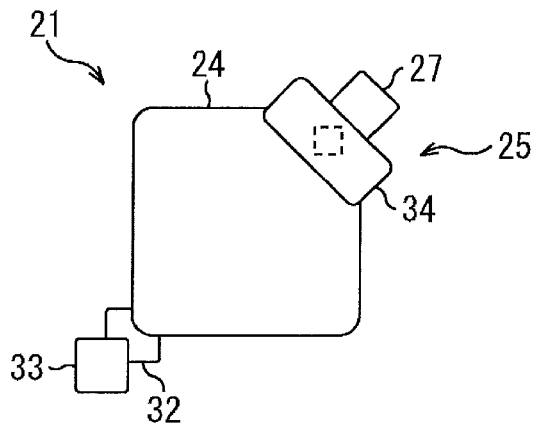
FIGS. 2A through 2C are diagrams illustrating a first configuration example of a pixel included in the image pickup element.

Next, a first configuration example of the pixel 21 will be described with reference to FIG. 2. FIG. 2A is a plan view illustrating a configuration of a pixel 21, FIG. 2B is a cross-section view illustrating a configuration of the pixel 21 and FIG. 2C is a cross-section view illustrating potential of the pixel 21.

Figure 2B:
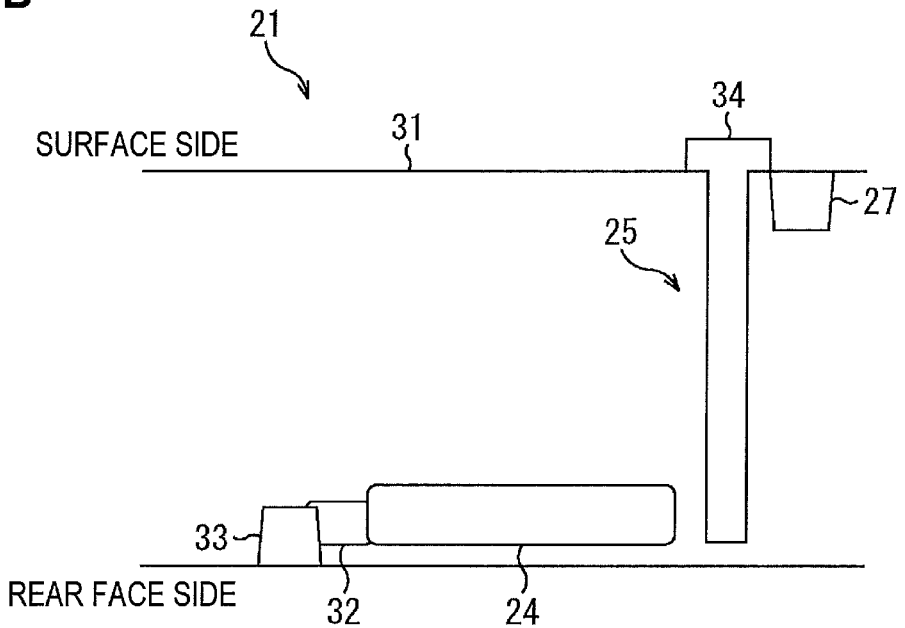
Figure 2C:
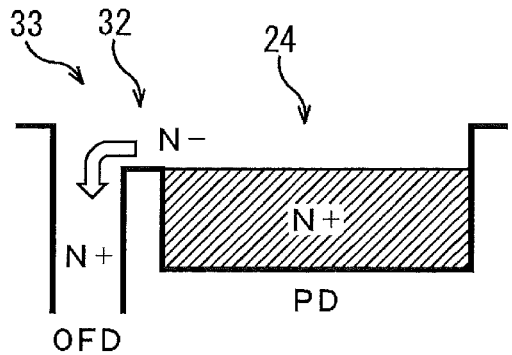

The pixel 21 includes PD 24 formed near a rear face of the silicon substrate 31 as illustrated in FIG. 2B. Note that, the image pickup element 11 is a so-called back side illumination CMOS sensor, for example, in which light is incident from a rear face (second face) of the silicon substrate 31 opposite to a surface (first face) on which a wire layer and the like are laminated.

PD 24 is an N+ region formed in a P-type well of the silicon substrate 31, for example, and disposed inside the silicon substrate 31 at a predetermined distance from the rear face so as not to touch the rear face of the silicon substrate 31. And the pixel 21 includes a potential barrier part 32 of an N− region formed so as to touch PD 24, and an overflow drain 33 of an N+ region formed so as to touch the potential barrier part 32. That is, in the pixel 21, the overflow drain 33 is formed near PD 24 such that PD 24 and the overflow drain 33 are connected via the potential barrier part 32.

The potential barrier part 32 is a low concentration N-type region compared with PD 24 and the overflow drain 33. Accordingly, potential larger than that of a P type well around the potential barrier part 32 and smaller than those of PD 24 and the overflow drain 33 is formed in the potential barrier part 32 as illustrated in FIG. 2C. Further, the potential barrier part 32 is disposed so as not to touch the rear face of the silicon substrate 31, so that an occurrence of dark current can be inhibited by performing pinning by a P-type region on the rear face portion of the silicon substrate 31.

The overflow drain 33 is formed so as to touch the rear face of the silicon substrate 31, and fixed to a voltage higher than potential generated in PD 24, for example, when a charge is stored in PD 24 via wiring connected to an end face of the overflow drain 33 on the rear face side. Because of this, a charge saturated during storing of a charge in PD 24 overflows (drained) on the overflow drain 33 and drained as illustrate in FIG. 2C. Note that, a configuration of the overflow drain 33 with a voltage fixed will be described later with reference to FIG. 3. Further, the overflow drain 33 is formed by ion implantation from a surface side or the rear face side of the silicon substrate 31.

Further in the pixel 21, the transfer transistor 25 is formed to have a vertical electrode 34 for transferring the charge generated in PD 24 formed near the rear face of the silicon substrate 31 to FD 27 formed on the surface side of the silicon substrate 31 so as to touch the surface. The vertical electrode 34 is formed from the surface of the silicon substrate 31 along a vertical direction of the silicon substrate 31 to near the rear face where PD 24 is formed. When a predetermined voltage is applied to the vertical electrode 34, the transfer transistor 25 is turned on whereby the charge generated in PD 24 by photoelectric conversion is transferred to FD 27.

The pixel 21 is configured as described above, so that the transfer transistor 25 serves as a pathway for transferring a charge when a signal is read out from PD 24 and the potential barrier part 32 serves as a pathway for overflowing a charge when PD 24 is saturated. That is, the pathway for reading out a signal and the pathway for overflowing a charge are different in the pixel 21.

Accordingly, in comparison with a structure in which a charge is overflowed by using the pathway for transferring the charge during a signal being read out from PD 24, for example, the charge can be overflowed more stable in the pixel 21. Further, because the overflow drain 33 is disposed near PD 24, the pathway can be easily formed.

In the past, CCD and a front side illumination CMOS sensor generally employ a structure of overflowing a charge to the side of a substrate disposed at a position deeper than PD. On the other hand, it is difficult for a back side illumination CMOS sensor to employ the above-described structure because there is no substrate at a position deeper than PD, so that a structure in which a charge is overflowed from PD to an N-type region such as FD is employed. In such structure, a pathway is formed in such a manner that the charge is preferentially overflowed by making potential between PD and the overflow drain be higher than others.

However, when the image pickup element 11 in which PD 24 is formed near the rear face of the silicon substrate 31 employs such structure, a phenomenon of a charge overflowed from PD 24 entering another pixel 21, that is, blooming may occur because a distance between PD 24 and FD 27 is extremely far. Accordingly, the image pickup element 11 can avoid an occurrence of blooming by providing the overflow drain 33 on the rear face side of the silicon substrate 31 near PD 24. Because of this, the structure can avoid a phenomenon that luminescence seems to emerge from and around a luminescent spot in an output image thereby improving picture quality.

In the pixel 21, a voltage is supplied penetrating through the silicon substrate 31 in the case where a voltage supply part supplying a voltage to the overflow drain 33 formed on the rear face side of the silicon substrate 31 is formed on the surface side of the silicon substrate. That is, the pixel 21 is configured such that a charge overflowed from PD 24 via the potential barrier part 32 can be drained from the overflow drain 33 to the surface side of the silicon substrate 31.

Next, a configuration example of draining a charge overflowed from PD 24 via the potential barrier part 32 will be described with reference to FIG. 3.

FIG. 3A through FIG. 3D illustrate pixels 21A-1 through 21A-4 having configurations different from one another. Note that, components of the pixels 21A-1 through 21A-4 in common with those in the pixel 21 illustrated in FIG. 2 are denoted by the same numerals and detailed description will be omitted.

Figure 3A:
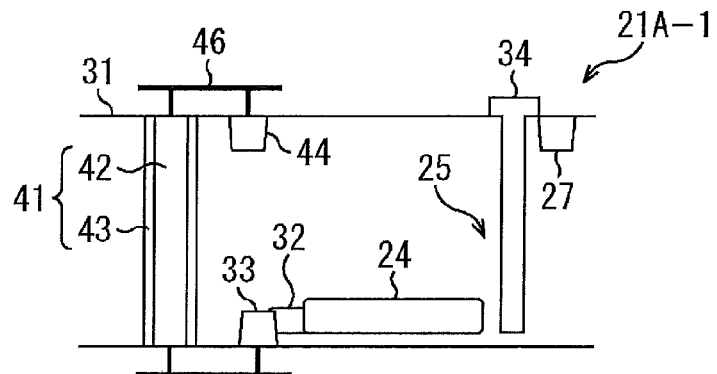
FIGS. 3A through 3D are diagrams illustrating configuration examples of draining a charge overflowed from PD via a potential barrier part.

FIG. 3A illustrates the pixel 21A-1 having a configuration in which TSV (Through Silicon Via) 41 is formed in a vertical hole formed so as to penetrate the silicon substrate 31.

TSV 41 is configured such that a periphery of a conductive portion 42 is covered with an insulation film 43 and metal or semiconductor containing high concentration impurities may be employed as the conductive portion 42. And wiring 45 connecting TSV 41 with the overflow drain 33 is provided on the rear face side of the silicon substrate 31. Further, a voltage supply part 44 connected to a power source not shown in the figure is formed and wiring 46 connecting TSV 41 with the voltage supply part 44 is provided on the surface side of the silicon substrate 31. With such configuration, the overflow drain 33 can be fixed to a predetermined voltage from the surface side of the silicon substrate 31 via TSV 41 in the pixel 21A-1.

Accordingly, the pixel 21A-1 can drain the charge overflowed from PD 24 to the overflow drain 33 via the potential barrier part 32 to the surface side of the silicon substrate 31 via TSV 41.

Figure 3B:
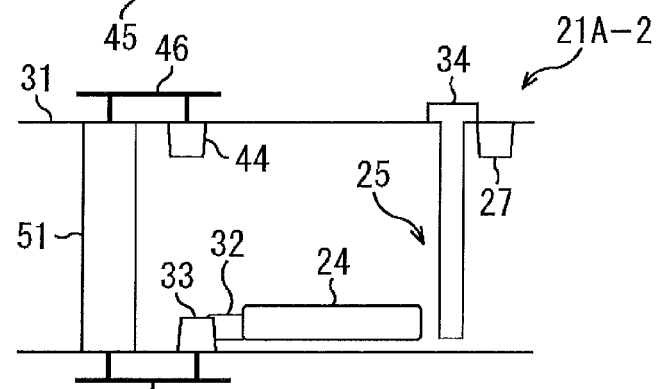

FIG. 3B illustrates the pixel 21A-2 having a configuration in which an ion implanted plug 51 is formed so as to touch the surface and rear face of the silicon substrate 31.

The ion implanted plug 51 is a high concentration semiconductor region (N+ region) formed by performing ion implantation multiple times from the surface side or from the rear face side with changing an accelerating voltage, for example. Note that, the ion implanted plug 51 may be formed by covering with an insulation film not shown in the figure around a high concentration semiconductor region at which the ion implanted plug 51 is to be formed as well as forming the ion implanted plug 51 directly (not covered with an insulation film) inside the silicon substrate 31 as illustrate in FIG. 3B.

Further, the wiring 45 connecting the ion implanted plug 51 with the overflow drain 33 is provided on the rear face side of the silicon substrate 31, and the wiring 46 connecting the ion implanted plug 51 with the voltage supply part 44 is provided on the surface side of the silicon substrate 31. With such configuration, the overflow drain 33 can be fixed to a predetermined voltage from the surface side of the silicon substrate 31 via the ion implanted plug 51 in the pixel 21A-2.

Accordingly, the pixel 21A-2 can drain the charge overflowed from PD 24 to the overflow drain 33 via the potential barrier part 32 to the surface side of the silicon substrate 31 via the ion implanted plug 51.

Figure 3C:
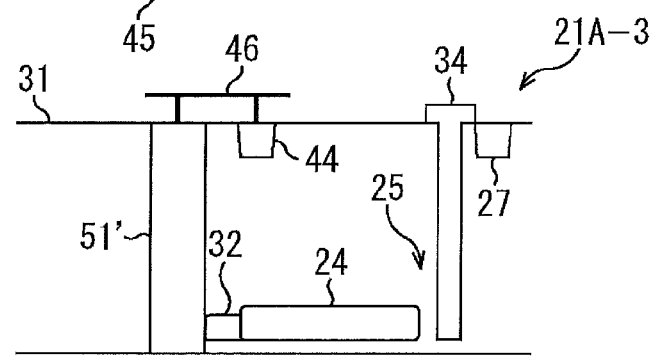

FIG. 3C illustrates the pixel 21A-3 having a configuration in which an ion implanted plug 51' is formed so as to touch the surface and rear face of the silicon substrate 31.

In the pixel 21A-3, the overflow drain 33 is not formed and PD 24 is connected with the ion implanted plug 51' via the potential barrier part 32 as illustrated in FIG. 3C. That is, in the pixel 21A-3, the ion implanted plug 51' has a function as wiring penetrating the silicon substrate 31 as well as having a function as the overflow drain on which a charge from PD 24 overflows.

Accordingly, the pixel 21A-3 can drain the charge overflowed from PD 24 to the ion implanted plug 51' via the potential barrier part 32 to the surface side of the silicon substrate 31 via the ion implanted plug 51'.

Figure 3D:
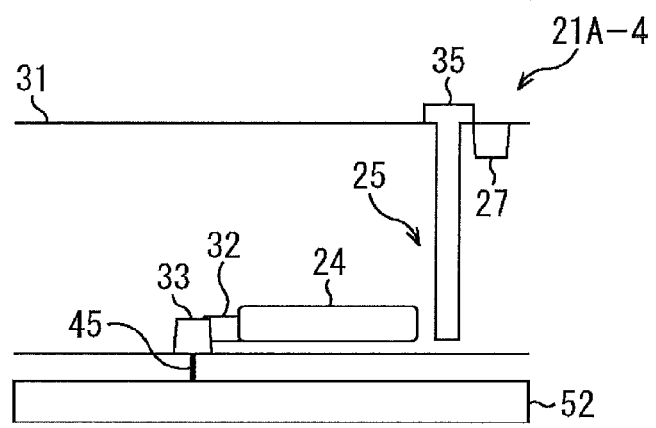

FIG. 3D illustrates the pixel 21A-4 having a configuration including a substrate 52 having a voltage supply part supplying a voltage on the rear face side of the silicon substrate 31. In such configuration with the substrate 52 being laminated on the rear face side of the silicon substrate 31, TSV 41 and the ion implanted plug 51 are unnecessary.

The substrate 52 and the overflow drain 33 are connected by the wiring 45 provided on the rear face side of the silicon substrate 31 as illustrated in FIG. 3D. The substrate 52 is laminated on the silicon substrate 31 by bonding of wafers or chips, for example. With such configuration, the overflow drain 33 can be fixed to a predetermined voltage from the voltage supply part of the substrate 52 via the wiring 45 in the pixel 21A-4.

Accordingly, the pixel 21A-4 can drain the charge overflowed from PD 24 via the potential barrier part 32 on the overflow drain 33 to the substrate 52.

Note that, a configuration in which TSV 41 or the ion implanted plug 51 is shared by a plurality of pixels 21 may be applicable other than configurations in which TSV 41 or the ion implanted plug 51 is provided for each pixel 21 as illustrated in FIGS. 3A-3D.

Figure 4:
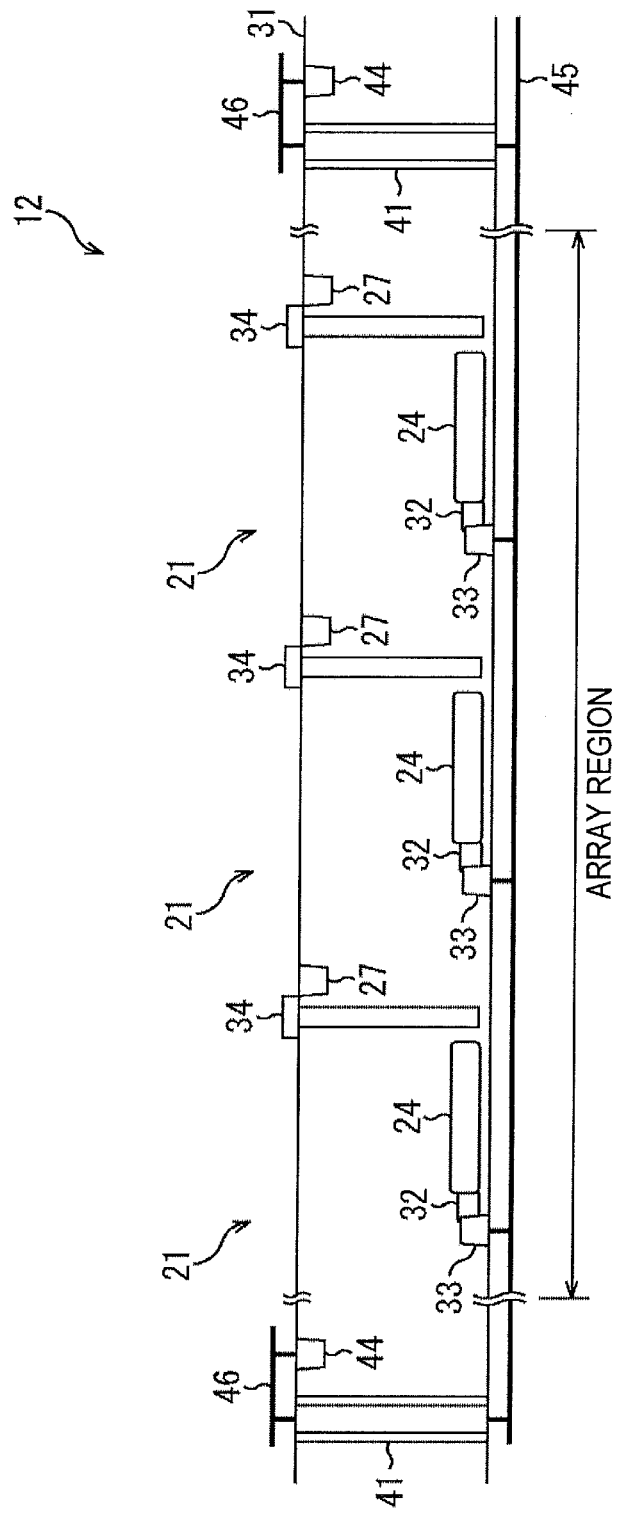
FIG. 4 is a diagram illustrating a configuration example in which a through silicon via is shared by a plurality of pixels.

FIG. 4 illustrates a configuration example of the pixel array part 12 in which TSV 41 is shared by a plurality of pixels 21.

As described above, the pixel array part 12 includes a plurality of pixels 21 arranged in arrays, and TSV 41 is formed on the outside of an array region in which the pixels 21 are arranged. For example, on the outside of both ends of each row of the pixels 21, TSVs 41 are formed. And the wiring 45 connected to the overflow drains 33 of respective pixels 21 is disposed on the rear face side of the silicon substrate 31 and both ends of the wiring 45 are connected to end faces of TSV 41 on the rear face side, respectively.

As described above, such configuration in which TSV 41 is shared by the plurality of pixels 21 can reduce an area in the pixel array part 12 occupied by TSV 41 with respect to the configuration of forming TSV 41 for each pixel 21. Note that, though the configuration example utilizing TSV 41 is illustrated in FIG. 4, the configuration utilizing the ion implanted plug 51 as illustrated in FIG. 3B may be applicable.

Alternatively, a configuration in which the overflow drain 33 is shared by a plurality of pixels 21 may be applicable.

Figure 5:
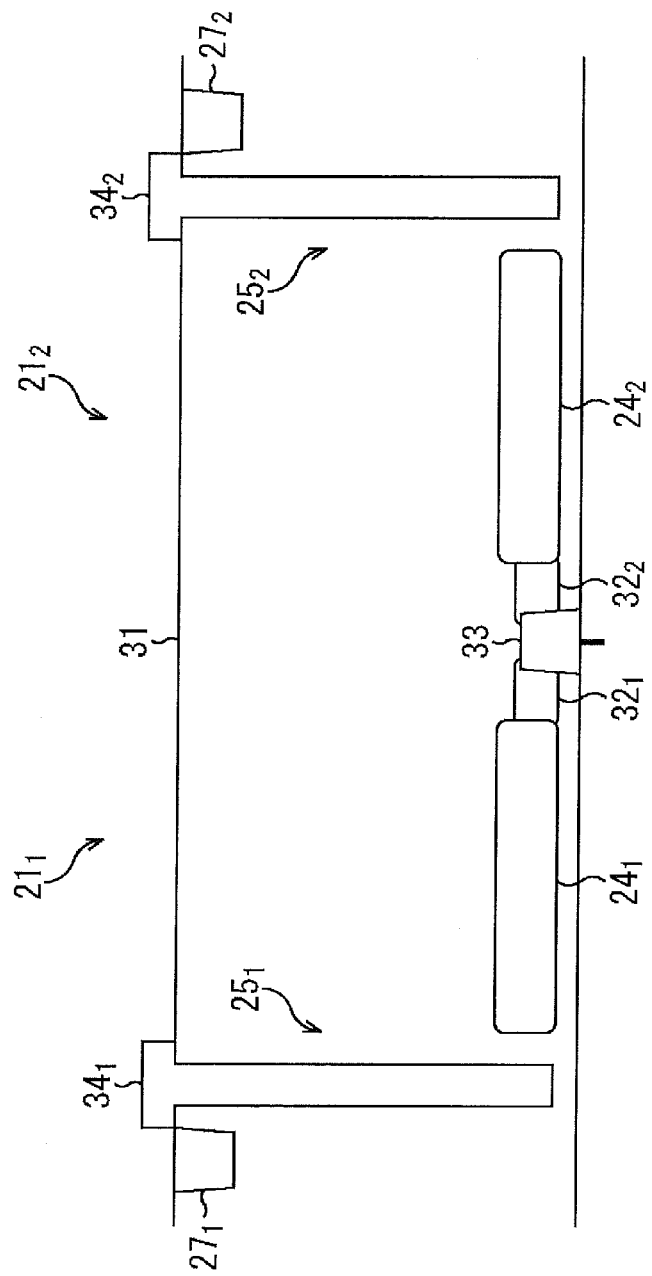
FIG. 5 is a diagram illustrating a configuration example in which an overflow drain is shared by a plurality of pixels.

For example, FIG. 5 illustrates a configuration example in which the overflow drain 33 is shared by two pixels, pixel $21_1$ and pixel $21_2$.

As illustrated in FIG. 5, in the neighboring pixel $21_1$ and pixel $21_2$, PD $24_1$ of the pixel $21_1$ is connected to the overflow drain 33 via a potential barrier part $32_1$ and PD $24_2$ of the pixel $21_2$ is connected to the overflow drain 33 via a potential barrier part $32_2$. And a charge saturated in the pixel $21_1$ and a charge saturated in the pixel $21_2$ overflow on the sharing overflow drain 33.

Such configuration can reduce an area in the pixel array part 12 occupied by the overflow drain 33 with respect to the configuration of forming the overflow drain 33 for each pixel 21. Note that, the configuration of sharing the overflow drain 33 may be applicable to any of configuration examples illustrated in FIG. 3.

A second configuration example and a third configuration example of the pixel 21 will be described with reference to FIG. 6. Note that, components in common with those in the pixel 21 illustrated in FIG. 2 are denoted by the same numerals and detailed description will be omitted.

Figure 6A:
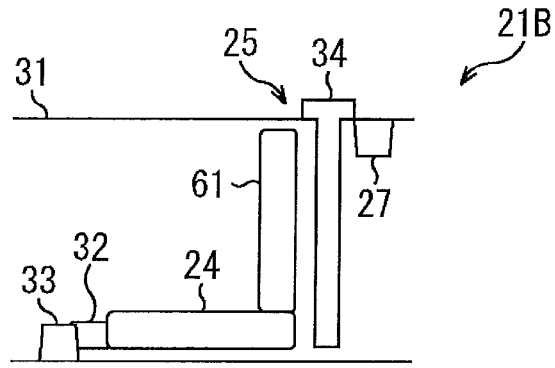
FIGS. 6A through 6D are diagrams illustrating second configuration examples and third configuration examples of the pixel.

FIG. 6A illustrates a pixel 21B of the second configuration example.

The pixel 21B has a configuration in common with the pixel 21 illustrated in FIG. 2 such that PD 24 formed near the rear face of the silicon substrate 31 is connected to the overflow drain 33 via the potential barrier part 32 and a charge is transferred to FD 27 via the transfer transistor 25 having the vertical electrode 34.

Unlike the pixel 21 illustrated in FIG. 2, the pixel 21B includes an ion implanted plug 61 formed along the transfer transistor 25 so as to extend from PD 24 on the side of FD 27 to near the surface of the silicon substrate 31. The ion implanted plug 61 is an N-type semiconductor region identical with PD 24. For example, the ion implanted plug 61 is a high concentration semiconductor region formed by performing ion implantation multiple times from the surface side or from the rear face side of the silicon substrate 31 changing an accelerating voltage, for example.

With such configuration, the charge from PD 24 can be moved to near the surface of the silicon substrate 31 by utilizing the ion implanted plug 61 in the pixel 21B, so that transfer of the charge from PD 24 to FD 27 can be performed more efficiently than the pixel 21.

Figure 6B:
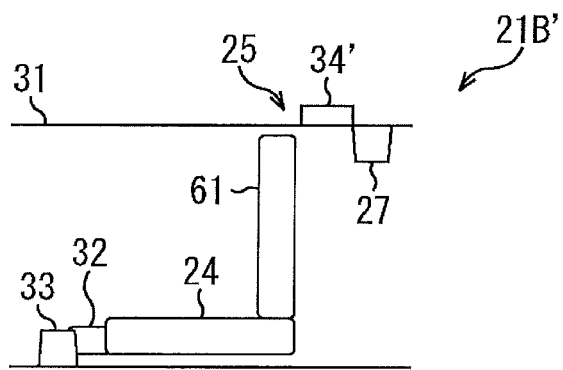

FIG. 6B illustrates a pixel 21B' that is a modification of the second configuration example.

Unlike the pixel 21B, a pixel 21B' includes a transfer transistor 25 formed to have a planar (not vertical in shape) gate electrode 34' on the surface side of the silicon substrate 31.

In the pixel 21B' with such configuration, when the transfer transistor 25 is turned on, the charge stored in PD 24 is moved to the surface side of the silicon substrate through the ion implanted plug 61 and transferred to FD 27 via the transfer transistor 25.

Figure 6C:
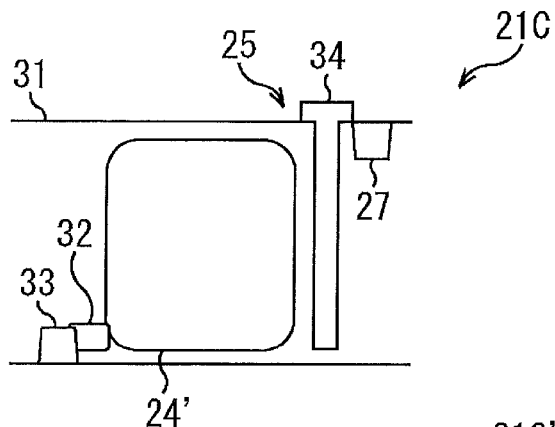

FIG. 6C illustrates a pixel 21C of a third configuration example.

In common with the pixel 21 illustrated in FIG. 2, the pixel 21C includes the potential barrier part 32, the overflow drain 33, the transfer transistor 25 having the vertical electrode 34, and FD 27. And unlike the pixel 21 illustrated in FIG. 2, PD 24' expands from near the rear face of the silicon substrate 31 to near the surface of the silicon substrate 31 in the pixel 21C. Note that, PD 24' has such concentration gradient that impurity concentration increases as toward the surface side of the silicon substrate 31 and decreases as toward the rear face side of the silicon substrate 31.

Figure 6D:
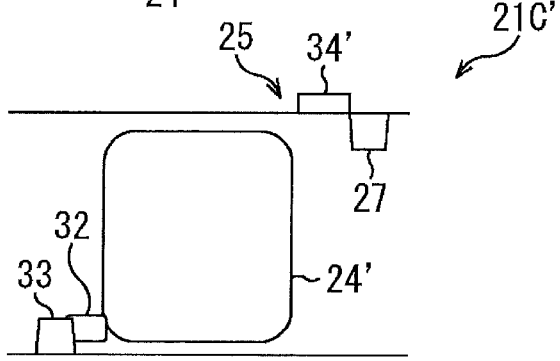

FIG. 6D illustrates a pixel 21C' that is a modification of the third configuration example.

Unlike the pixel 21C, the pixel 21C' includes the transfer transistor 25 having a planar gate electrode 34' formed on the surface side of the silicon substrate.

As described above, the pixel 21 may employ either of the configuration provided with the transfer transistor 25 having the vertical electrode 34 as the pixel 21B and the pixel 21C, or the configuration provided with the transfer transistor 25 having the planar gate electrode 34'.

Next, a fourth configuration example of the pixel 21 will be described with reference to FIG. 7. Note that, components in common with the pixel 21 illustrated in FIG. 2 are denoted by the same numerals and the detailed description will be omitted.

Figure 7A:
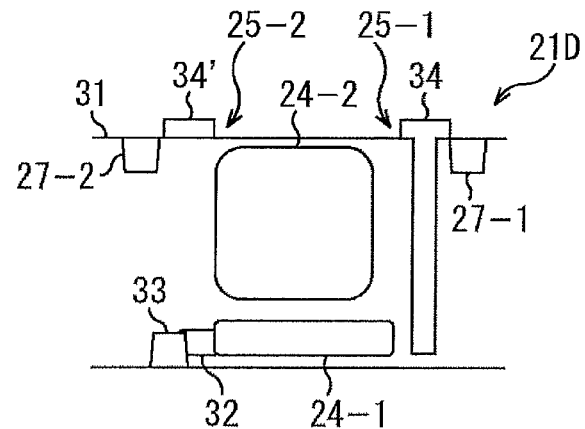
FIGS. 7A through 7C are diagrams illustrating fourth configuration examples of the pixel.

FIG. 7A illustrates a pixel 21D of the fourth configuration example.

The pixel 21D includes two PDs, PD 24-1 and PD 24-2 disposed in line in the vertical direction of the silicon substrate 31. PD 24-1 is formed near the rear face of the silicon substrate 31 and connected to the overflow drain 33 via the potential barrier part 32. PD 24-2 is formed from the center to near the surface of the silicon substrate 31.

Further, the pixel 21D is provided with a transfer transistor 25-1 having the vertical electrode 34 for reading out a charge from PD 24-1 and provided with a transfer transistor 25-2 having the planar gate electrode 34' for reading out a charge from PD 24-2.

In general, a photodiode formed near an optical incidence side photoelectrically converts light on a short wavelength side and a photodiode formed far from the optical incidence side photoelectrically converts light on a long wavelength side. Accordingly, in the pixel 21D, PD 24-1 photoelectrically converts light on the short wavelength side and a charge corresponding to an amount of light received of the short wavelength side is transferred to FD 27-1 via the transfer transistor 25-1. PD 24-2 photoelectrically converts light on the long wavelength side and a charge corresponding to an amount of light received of the long wavelength side is transferred to FD 27-2 via the transfer transistor 25-2.

As described above, a signal of PD 24-1 and a signal of PD 24-2 can be separately read out from the pixel 21D, and incident light to the pixel 21D can be dispersed. Or a saturated charge amount of the pixel 21D can be increased by combination of signals readout from PD 24-1 and PD 24-2.

Figure 7B:
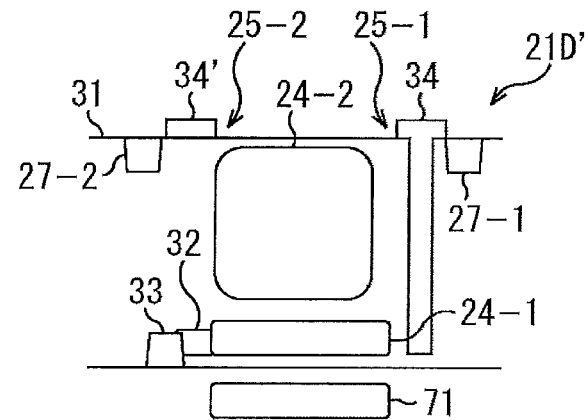

FIG. 7B illustrates a pixel 21D' that is a modification of the fourth configuration example.

Unlike the pixel 21D, the pixel 21D' includes a color filter 71 on the rear face side of the silicon substrate 31. In the pixel 21D', light transmitted through the color filter 71 is photoelectrically converted by PD 24-1 and PD 24-2. That is, a wavelength of incident light on PD 24-1 and PD 24-2 are selected by the color filter 71. Then, a charge corresponding to an amount of received light of a wavelength transmitted through the color filter 71 is transferred to FD 27-1 and FD 27-2 via the transfer transistor 25-1 and the transfer transistor 25-2, respectively.

Figure 7C:
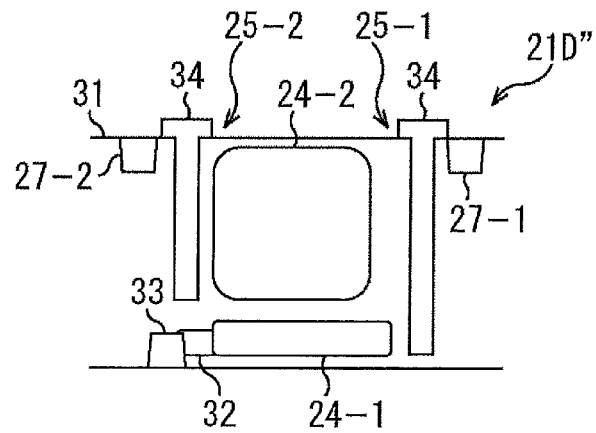

FIG. 7C illustrates a pixel 21D" of another modification of the fourth configuration example.

Unlike the pixel 21D, the pixel 21D" includes a transfer transistor 25-2 having a vertical electrode 34. The transfer transistor 25-1 and the transfer transistor 25-2 are different in length. The transfer transistor 25-1 has a length from the surface of the silicon substrate 31 to near the rear face of the silicon substrate 31 where PD 24-1 is formed. The transfer transistor 25-2 has a length from the surface of the silicon substrate 31 to a depth corresponding to a region where PD 24-2 is formed.

Note that, though "a configuration example in which two PDs, PD 24-1 and PD 24-2 are disposed is described as to the pixel 21D", more than two PDs 24 may be disposed in line in the vertical direction of the silicon substrate 31.

Next, a fifth configuration example of the pixel 21 will be described with reference to FIG. 8. Note that, components in common with the pixel 21 illustrated in FIG. 2 are denoted by the same numerals and detailed description will be omitted.

Figure 8:
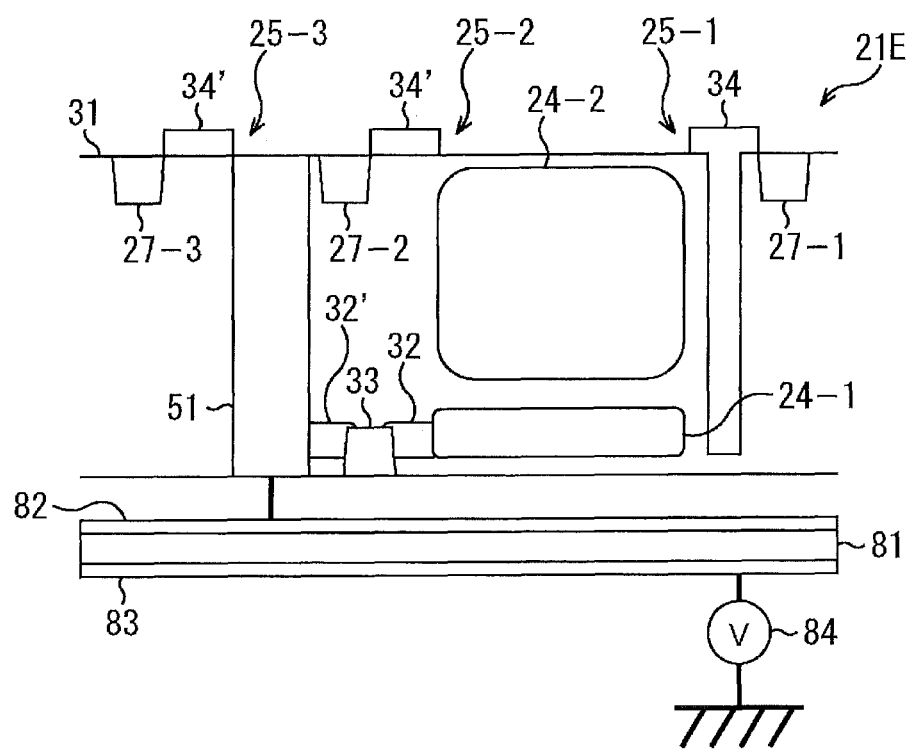
FIG. 8 is a diagram illustrating a fifth configuration example of the pixel.

The pixel 21E illustrated in FIG. 8 includes two PDs, PD 24-2 and PD 24-2 disposed in line in the vertical direction of the silicon substrate 31 and a photoelectric conversion film 81 laminated on the rear face side of the silicon substrate 31.

PD 24-1 is formed near the rear face of the silicon substrate 31 and connected to the overflow drain 33 via the potential barrier part 32. Further, the transfer transistor 25-1 having the vertical electrode 34 for transferring a charge of PD 24-1 to FD 27-1 is formed.

PD 24-2 is formed from the center to near the surface of the silicon substrate 31. The transfer transistor 25-2 having a planar gate electrode 34' for transferring a charge of PD 24-2 to FD 27-2 is formed.

The photoelectric conversion film 81 is sandwiched between an upper electrode 82 and a lower electrode 83 each made of a transparent and conductive material. The upper electrode 82 is connected to the ion implanted plug 51 via wiring and the lower electrode 83 is connected to a constant-voltage source 84. A charge photoelectrically converted by the photoelectric conversion film 81 becomes capable of being readout to the ion implanted plug 51 via the upper electrode 82 by a voltage applied to the photoelectric conversion film 81 by the constant-voltage source 84. Then, when a voltage is applied to the planar gate electrode 34' and the transfer transistor 25-3 is turned on, the charge photoelectrically converted by the photoelectric conversion film 81 is transferred to FD 27-3.

Further, the ion implanted plug 51 is connected to the overflow drain 33 via a potential barrier part 32', and a charge saturated at the photoelectric conversion film 81 and the ion implanted plug 51 overflows on the overflow drain 33 via the potential barrier part 32'. That is, in the pixel 21E, PD 24-1 and the photoelectric conversion film 81 share the overflow drain 33.

In the pixel 21E having such configuration, light photoelectrically converted by the photoelectric conversion film 81 among incident light can be taken out as an output, and light transmitted through the photoelectric conversion film 81 can be taken by PD 24-1 and PD 24-2.

Accordingly, incident light on the pixel 21D can be dispersed by separate readout of signals of PD 24-1, PD 24-2 and the photoelectric conversion film 81. For example, such configuration may be applicable that the photoelectric conversion film 81 photoelectrically converts green light, PD 24-1 photoelectrically converts blue light and PD 24-2 photoelectrically converts red light.

Or, a saturated charge amount of the pixel 21E can be increased by adding the signal readout from the photoelectric conversion film 81 and the signals readout from PD 24-1 and PD 24-2.

Note that, the overflow drain 33 formed on the rear face side of the silicon substrate 31 may be used as a semiconductor region for reading out a charge from the photoelectric conversion film 81.

Figure 9A:
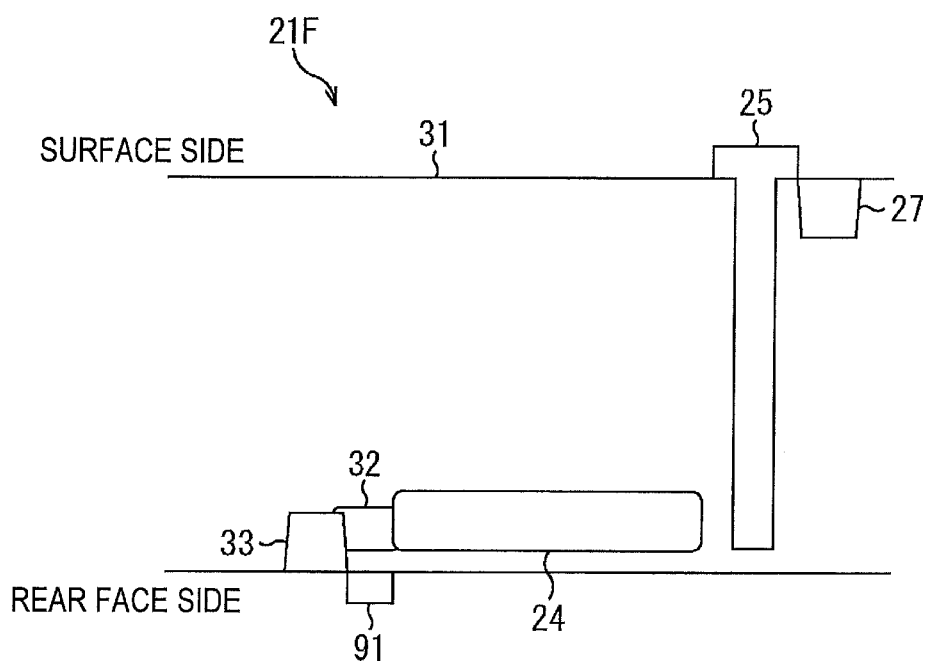
FIGS. 9A and 9B are diagrams illustrating a sixth configuration example of the pixel.
Figure 9B:
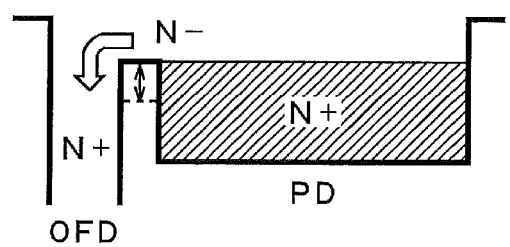

Next, a sixth configuration example of the pixel 21 will be described with reference to FIG. 9. Note that, components in common with those in the pixel 21 illustrated in FIG. 2 are denoted by the same numerals and detailed description will be omitted. FIG. 9A illustrates a cross section view of a pixel 21F and FIG. 9B illustrate cross section potential of the pixel 21F.

Unlike the pixel 21 illustrated in FIG. 2, the pixel 21F includes a rear-face-side gate 91 provided on the rear face of the silicon substrate 31. The rear-face-side gate 91 is disposed on the rear face of the silicon substrate 31 at the position corresponding to the position of the potential barrier part 32. Accordingly, when a voltage is applied to the rear-face-side gate 91, potential of the potential barrier part 32 varies as indicated by a dashed line in FIG. 9B.

Because of this, ease of overflow from PD 24 on the overflow drain 33 can be controlled by adjustment of potential of the potential barrier part 32 in the pixel 21F.

Here, the image pickup element 11 as described above may be applicable to various kinds of electronic devices such as an image pickup system like a digital still camera and a digital video camera, a mobile telephone equipped with an image pickup function, and another device equipped with an image pickup function.

Figure 10:
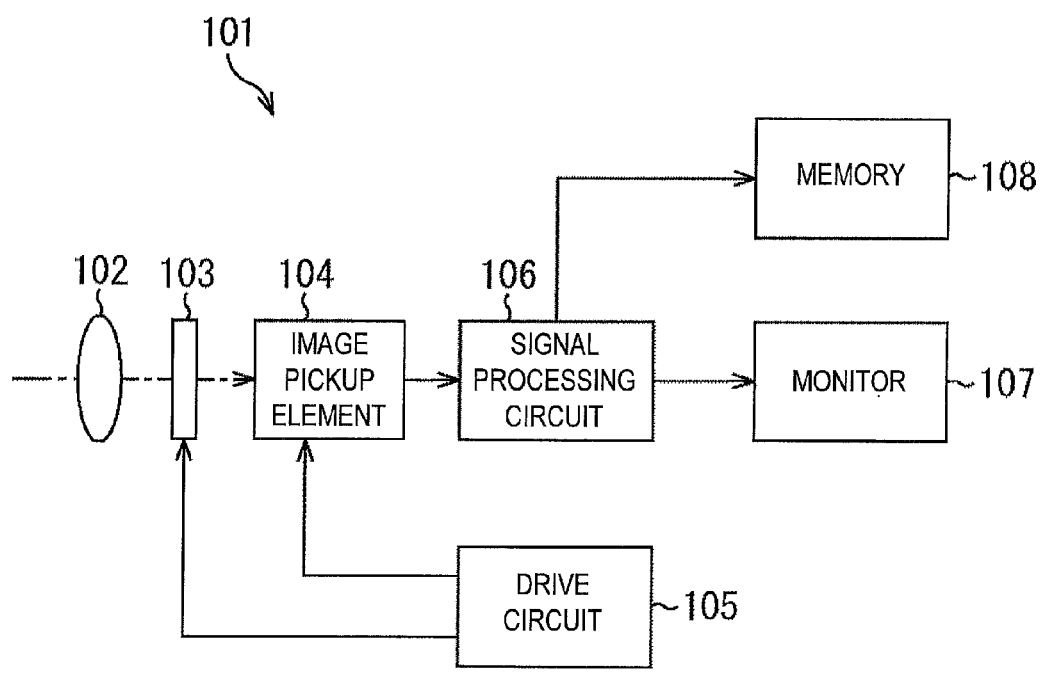
FIG. 10 is a block diagram illustrating a configuration example of an electronic device.

FIG. 10 is a block diagram illustrating a configuration example of an image pickup device loaded on an electronic device.

As illustrated in FIG. 10, an image pickup device 101 includes an optical system 102, a shutter arrangement 103, an image pickup element 104, a drive circuit 105, a signal processing circuit 106, a monitor 107 and a memory 108, and can take a still image or a dynamic picture image.

The optical system 102 includes one or a plurality pieces of lens, for guiding image light (incident light) from an object to the image pickup element 104 to provide an image to an acceptance surface (sensor part) of the image pickup element 104.

The shutter arrangement 103 is disposed between the optical system 102 and the image pickup element 104, and controls a light irradiation period and a light shielding period for the image pickup element 104 in accordance with control by the drive circuit 105.

As the image pickup element 104, one of the image pickup elements 11 of the configuration examples and modifications in the above described embodiments is applied. A signal charge is stored in the image pickup element 104 for a certain time of period in accordance with the image formed on the acceptance surface via the optical system 102 and the shutter arrangement 103. Then, the signal charge stored in the image pickup element 104 is transferred in response to a drive signal (timing signal) supplied from the drive circuit 105.

The drive circuit 105 outputs drive signals for controlling a transfer operation of the image pickup element 104 and a shutter operation of the shutter arrangement 103, respectively, to drive the image pickup element 104 and the shutter arrangement 103.

The signal processing circuit 106 performs various kinds of signal processing on the signal charge output from the image pickup element 104. An image (image data) obtained by performance of signal processing by the signal processing circuit 106 is supplied to the monitor 107 to be displayed, or supplied to the memory 108 to be stored (recorded).

The image pickup device 101 as configured above can improve picture quality by application of the above-described image pickup element 11 as the image pickup element 104.

Further, the configuration of the image pickup element 11 according to the present technology can be applied to a back side illumination CMOS solid-state image pickup element, front side illumination CMOS solid-state image pickup element and CCD solid-state image pickup element.

Additionally, the present technology may also be configured as below.

(1) A solid-state image pickup element including:
  a pixel array part in which a plurality of pixels are arranged on a silicon substrate in arrays; and
  a drive part driving the pixel,
wherein the pixel includes:
  a photoelectric conversion part formed near a second face of the silicon substrate opposite to a first face on which a wiring layer is laminated, for generating a charge corresponding to incident light;

an overflow part formed in contact with the second face and fixed to a predetermined voltage; and a potential barrier part formed to be connected with the photoelectric conversion part and the overflow part, for serving as a barrier against a charge overflowed from the photoelectric conversion part on the overflow part.

(2) The solid-state image pickup element according to (1), wherein the pixel further includes:

a floating diffusion region formed in contact with the first face; and a transfer part transferring the charge photoelectrically converted by the photoelectric conversion part to the floating diffusion region in accordance with control by the drive part.

(3) The solid-state image pickup element according to (1) or (2), wherein the transfer part includes an electrode formed between the photoelectric conversion part and the floating diffusion region along a vertical direction running from the first face to the second face.

(4) The solid-state image pickup element according to (1) or (2), wherein the pixel further includes a semiconductor region formed of an impurity of the type identical to that of the photoelectric conversion part so as to extend from the photoelectric conversion part on the floating diffusion region side to the first face; and the transfer part includes a planar electrode laminated on the first face between the semiconductor region and the floating diffusion region.

(5) The solid-state image pickup element according to any one of (1) to (4), wherein an electrode or an ion implanted plug for supplying a voltage from a voltage supply part is formed on the first face side to the overflow part formed on the second face side.

(6) The solid-state image pickup element according to any one of (1) to (5), wherein the electrode or the ion implanted plug is formed on the pixel array part on the outside of a region where the plurality of pixels are arranged.

(7) The solid-state image pickup element according to any one of (1) to (6), wherein the photoelectric conversion part of each pixel among the plurality of pixels is connected with the shared overflow part.

(8) The solid-state image pickup element according to claim any one of (1) to (7), wherein a plurality of photoelectric conversion parts are formed in line along a vertical direction running from the first face to the second face.

(9) The solid-state image pickup element according to any one of (1) to (8), further including a photoelectric conversion layer laminated on the second face side of the silicon substrate for generating a charge corresponding to incident light.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2011-170735 filed in the Japan Patent Office on Aug. 4, 2011, the entire content of which is hereby incorporated by reference.

What is claimed is:

1. A solid-state image pickup element comprising:
a pixel array part in which a plurality of pixels are arranged on a silicon substrate in arrays; and
a drive part driving the pixel,
wherein the pixel includes:
a photoelectric conversion part formed near a second face of the silicon substrate opposite to a first face on which a wiring layer is laminated, for generating a charge corresponding to incident light;
an overflow part formed in contact with the second face and fixed to a predetermined voltage; and
a potential barrier part formed to be connected with the photoelectric conversion part and the overflow part, for serving as a barrier against a charge overflowed from the photoelectric conversion part on the overflow part.

2. The solid-state image pickup element according to claim 1, wherein the pixel further includes:
a floating diffusion region formed in contact with the first face; and
a transfer part transferring the charge photoelectrically converted by the photoelectric conversion part to the floating diffusion region in accordance with control by the drive part.

3. The solid-state image pickup element according to claim 2, wherein the transfer part includes an electrode formed between the photoelectric conversion part and the floating diffusion region along a vertical direction running from the first face to the second face.

4. The solid-state image pickup element according to claim 2, wherein the pixel further includes a semiconductor region formed of an impurity of the type identical to that of the photoelectric conversion part so as to extend from the photoelectric conversion part on the floating diffusion region side to the first face; and
the transfer part includes a planar electrode laminated on the first face between the semiconductor region and the floating diffusion region.

5. The solid-state image pickup element according to claim 1, wherein an electrode or an ion implanted plug for supplying a voltage from a voltage supply part is formed on the first face side to the overflow part formed on the second face side.

6. The solid-state image pickup element according to claim 5, wherein the electrode or the ion implanted plug is formed on the pixel array part on the outside of a region where the plurality of pixels are arranged.

7. The solid-state image pickup element according to claim 1, wherein the photoelectric conversion part of each pixel among the plurality of pixels is connected with the shared overflow part.

8. The solid-state image pickup element according to claim 1, wherein a plurality of photoelectric conversion parts are formed in line along a vertical direction running from the first face to the second face.

9. The solid-state image pickup element according to claim 8, further comprising
a photoelectric conversion layer laminated on the second face side of the silicon substrate for generating a charge corresponding to incident light.

10. The solid-state image pickup element according to claim 1 further comprising:
an electrode part disposed on the second face side of the silicon substrate at a position corresponding to the potential barrier part, for controlling potential of the potential barrier part.

11. An electronic device incorporating a solid-state image pickup element comprising:
a pixel array part in which a plurality of pixels are arranged on a silicon substrate in arrays; and
a drive part driving the pixels,
wherein the pixel includes:

a photoelectric conversion part formed near a second face of the silicon substrate opposite to a first face on which a wiring layer is laminated, for generating a charge corresponding to incident light;

an overflow part formed in contact with the second face and fixed to a predetermined voltage; and a potential barrier part formed to be connected with the photoelectric conversion part and the overflow part, for serving as a barrier against a charge overflowed from the photoelectric conversion part on the overflow part.

* * * * *